US009196361B2

(12) United States Patent
Lee et al.

(10) Patent No.: US 9,196,361 B2
(45) Date of Patent: Nov. 24, 2015

(54) MEMORY STRUCTURE AND OPERATION METHOD THEREFOR

(71) Applicant: MACRONIX INTERNATIONAL CO., LTD., Hsinchu (TW)

(72) Inventors: Ming-Hsiu Lee, Hsinchu (TW); Feng-Min Lee, Hsinchu (TW); Yu-Yu Lin, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 39 days.

(21) Appl. No.: 14/085,839

(22) Filed: Nov. 21, 2013

(65) Prior Publication Data

US 2015/0138871 A1   May 21, 2015

(51) Int. Cl.
    *G11C 13/00* (2006.01)
(52) U.S. Cl.
    CPC ........ *G11C 13/0069* (2013.01); *G11C 13/0002* (2013.01); *G11C 13/003* (2013.01); *G11C 13/0004* (2013.01); *G11C 13/0007* (2013.01); *G11C 13/0011* (2013.01); *G11C 13/0097* (2013.01); *G11C 2013/0073* (2013.01); *G11C 2013/0078* (2013.01); *G11C 2213/79* (2013.01)
(58) Field of Classification Search
    CPC ............... G11C 11/00; G11C 13/0002; G11C 13/0004; G11C 13/0011

USPC ............................................. 365/148, 189.16
See application file for complete search history.

(56) References Cited

U.S. PATENT DOCUMENTS

| 7,894,253 | B2 | 2/2011 | Kreupl et al. | |
|---|---|---|---|---|
| 2010/0265757 | A1* | 10/2010 | Otsuka | 365/148 |
| 2011/0007553 | A1* | 1/2011 | Takagi et al. | 365/148 |
| 2011/0310655 | A1 | 12/2011 | Kreupl et al. | |

OTHER PUBLICATIONS

Office Action issued in corresponding Taiwan application on Jun. 10, 2015.

* cited by examiner

*Primary Examiner* — Huan Hoang
*Assistant Examiner* — Muna A Techane
(74) *Attorney, Agent, or Firm* — McClure, Qualey & Rodack, LLP (57) ABSTRACT

Provided is an operation method applicable to a resistive memory cell including a transistor and a resistive memory element. The operation method includes: in a programming operation, generating a programming current flowing through the transistor and the resistive memory element so that a resistance state of the resistive memory element changes from a first resistance state into a second resistance state; and in an erase operation, generating an erase current from a well region of the transistor to the resistive memory element but keeping the erase current from flowing through the transistor, so that the resistance state of the resistive memory element changes from the second resistance state into the first resistance state.

16 Claims, 7 Drawing Sheets

MEMORY STRUCTURE AND OPERATION METHOD THEREFOR

TECHNICAL FIELD

The disclosure relates in general to a memory structure and an operation method therefor, and more particularly to a resistive random memory structure and an operation method therefor.

BACKGROUND

Resistive random-access memory draws more and more attention. Resistive random-access memory has advantages of such as high density, low cost, low power consumption, high operation speed, good data storage and simple structure.

Basic structure of a resistive random-access memory is classified as 1T1R (one transistor and one resistor) and 1T1D (one transistor and one diode). By applying bias voltage to change resistance of the resistive random-access memory to perform programming or erase, the resistive random-access memory is in a high resistance state or a low resistance state, that is, in logic o or logic 1.

Common types of the resistive random-access memory includes: a Transition Metal Oxide (TMO) ReRAM, a conduction bridge memory and a phase change memory.

For better control, usually, a memory element is coupled to a transistor (i.e. 1T1R). In order to program the memory element, a current flows through the memory element in one direction; and in order to erase the memory element, another current flows through the memory element in a reverse direction. One of the efforts is to improve operation efficiency of the resistive random-access memory and to lower operation failure rate.

SUMMARY

The disclosure is directed to a memory structure and an operation method therefor. In an erase operation, an erase current does not flow through a transistor to eliminate a body effect of the transistor. Therefore, the programming/erase operation of the resistive random-access memory has better efficiency.

According to one embodiment, provided is an operation method applicable to a resistive memory cell including a transistor and a resistive memory element. The operation method includes: in a programming operation, flowing a programming current through the transistor and the resistive memory element to change the resistive memory element from a first resistance state into a second resistance state; and in an erase operation, flowing an erase current from a well region of the transistor to the resistive memory element to change the resistive memory element from the second resistance state into the first resistance state, wherein the erase current does not flow through the transistor.

According to another embodiment, provided is a memory structure. The memory structure includes: a plurality of resistive memory cells, arranged in an array; a plurality of drain signal lines, each drain signal line coupled to the resistive memory cells in the same column; a plurality of gate signal lines, each gate signal line coupled to the resistive memory cells in the same row, and each drain signal line vertical to each gate signal line; a plurality of source signal lines, each source signal line coupled to the resistive memory cells in the same column or in the same row and each source signal line vertical or parallel to each drain signal line; and a plurality of well signal lines, each well signal line coupled to respective well regions of respective transistors of the resistive memory cells in the same column or in the same row and each well signal line vertical or parallel to each drain signal line.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Technical terms of the disclosure are based on general definition in the technical field related to the disclosure. If the disclosure describes or explains one or some terms, definition of the terms are based on the description or explanation of the disclosure. Details of common technologies or theories in the related technical field are omitted in the following description if they do not involve technical features of this disclosure. Shapes, sizes and ratios of the objects in the drawings are exemplary for one skilled person in the art to understand the disclosure, not to limit the disclosure.

Each of the disclosed embodiments has one or more technical features. In possible implementation, one skilled person in the art would selectively implement part or all technical features of any embodiment of the disclosure or selectively combine part or all technical features of the embodiments of the disclosure.

Figure 1A:
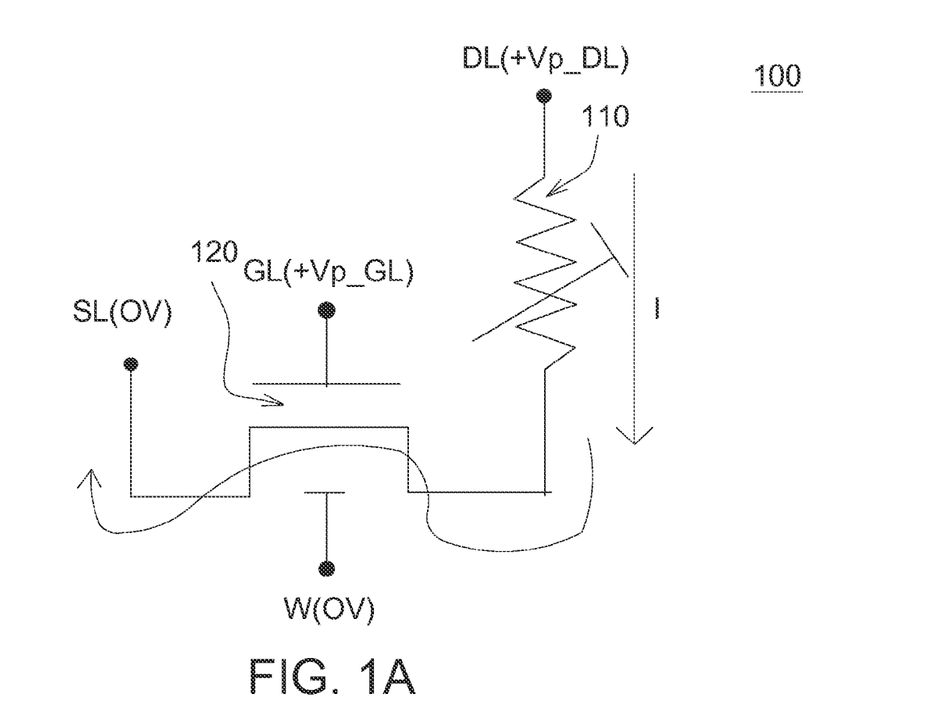
FIG. 1A shows a programming operation for a resistive memory according to an embodiment of the disclosure.
Figure 1B:
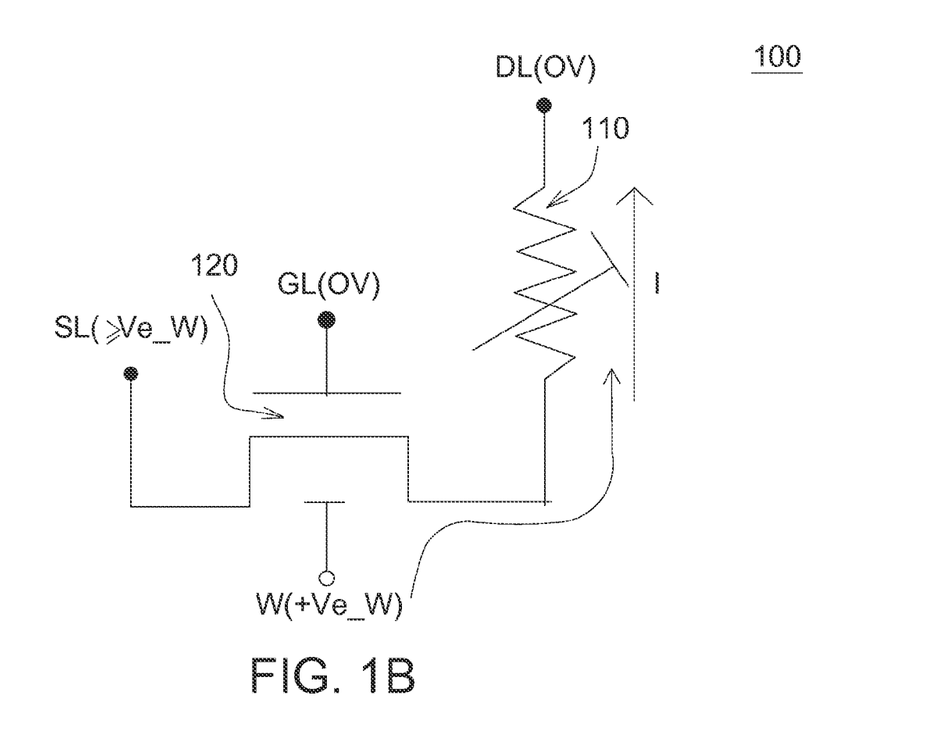
FIG. 1B shows an erase operation for the resistive memory according to the embodiment of the disclosure.

Referring to FIGS. 1A and 1B which show operations for a resistive memory according to an embodiment of the disclosure. The resistive memory cell 100 includes a resistive memory element 110 and a transistor 120. For simplicity, the transistor 120 is an NMOS transistor but the disclosure is not limited by this.

The resistive memory element 110 is coupled to a first signal line (for example, a drain signal line DL) and a terminal of the transistor 120 (for example, a drain terminal of the transistor 120). The transistor 120 has four terminals coupled to a terminal of the resistive memory element, a second signal line (for example, a gain signal line GL), a third signal line (for example, a source signal line SL) and a fourth signal line (for example, a well signal line W), respectively.

For simplicity, the resistive memory element 110 has two resistance states, i.e. a high resistance state and a low resistance state, which is just an example but not to limit to the disclosure. Therefore, the resistive memory cell 100 stores one bit, i.e. logic 0 or logic 1. That is, the resistive memory cell 100 is a single bit memory cell. However, the resistive memory element 110 may have more resistance states and the resistive memory cell 100 may store multiple bits. For example, if the resistive memory element 110 may have four resistance states, then the resistive memory cell 100 may store two bits.

FIG. 1A shows a program operation for the resistive memory cell 100 and FIG. 1B shows an erase operation for the resistive memory cell 100.

Referring to FIG. 1A. In the embodiment of the disclosure, in programming, the resistive memory element 110 is changed from a high resistance state into a low resistance state. The voltage biasing is as follows. A positive bias voltage (+Vp_DL) is applied on the drain signal line DL, a positive bias voltage (+Vp_GL) is applied on the gate signal line GL and 0V (i.e. a ground voltage) is applied on both the well signal line W and the source signal line SL. Because a positive bias voltage (+Vp_GL) is applied on the gate signal line GL, the transistor 120 is turned ON.

By this voltage biasing, in programming, a current I (which is also referred as a programming current) flows from the drain signal line DL to the source signal line SL via the resistive memory element 110 and the transistor 120.

Referring to FIG. 1B. In the embodiment of the disclosure, in erase, the resistive memory element 110 is changed from a low resistance state into a high resistance state. The voltage biasing is as follows. 0V (i.e. a ground voltage) is applied on both the drain signal line DL and the gate signal line GL, a positive bias voltage (+Ve_W) is applied on the well signal line W and a higher positive bias voltage (≥+Ve_W) is applied on the source signal line SL. In erase, the reason to apply a higher positive bias voltage (≥+Ve_W) on the source signal line SL than the positive bias voltage (+Ve_W) applied on the well signal line W is to prevent current reversing, that is to prevent the current flowing from the well region of the transistor 120 into the source signal line SL.

By this voltage biasing, in erase, the current I (which is also referred as an erase current) flows from the well region of the transistor 120 to the resistive memory element 110 and the drain signal line DL.

That is, as shown in FIGS. 1A and 1B, the programming current flowing through the resistive memory element 110 is in a reverse direction from the erase current flowing through the resistive memory element 110. By the voltage biasing, the resistance state of the resistive memory element 110 is changed and thus the resistive memory element 110 is programmed or erased.

Besides, in programming, because the transistor 120 is in saturation, the program current is fixed. Even if the resistance of the resistive memory element 110 changes with the operation, the current flowing through the resistive memory cell 100 is still fixed. By so, this prevents that a sudden large current flows through the resistive memory element 110 and burns the resistive memory element 110.

In erase, the resistive memory element 110 is changed from a low resistance state into a high resistance state. In other words, in erase, the resistance of the resistive memory element 110 is higher. Thus, if the resistive memory cell 100 is operated longer, the erase current I is smaller (that is because the positive bias voltage applied to the well signal line W is fixed). Therefore, the erase operation is also safe for the resistive memory element 110 and this prevents that a sudden large current flows through the resistive memory element 110 and burns the resistive memory element 110.

Further, in the disclosed embodiment, the program current has a direction asymmetric to the erase current. That is to say, as discussed above, in program operation, the program current flows from the drain signal line DL to the source signal line SL via the resistive memory element 110 and the transistor 120. In erase operation, the erase current flows from the well region of the transistor 120 to the resistive memory element 110 and the drain signal line DL.

Besides, in applying the bias voltage, the bias voltage is not necessary a fixed voltage and may be a pulse, a triangular wave or a step wave. For example, as shown in FIG. 1A, the positive bias voltage +Vp_DL applied to the drain signal line DL may be a fixed positive voltage but the positive bias voltage +Vp_GL applied to the gate signal line GL may be a pulse, a triangular wave or a step wave. Alternatively, the positive bias voltage +Vp_DL applied to the drain signal line DL may be a pulse, a triangular wave or a step wave but the positive bias voltage +Vp_GL applied to the gate signal line GL may be a fixed positive voltage. This is still within the scope of the disclosure.

Figure 2:
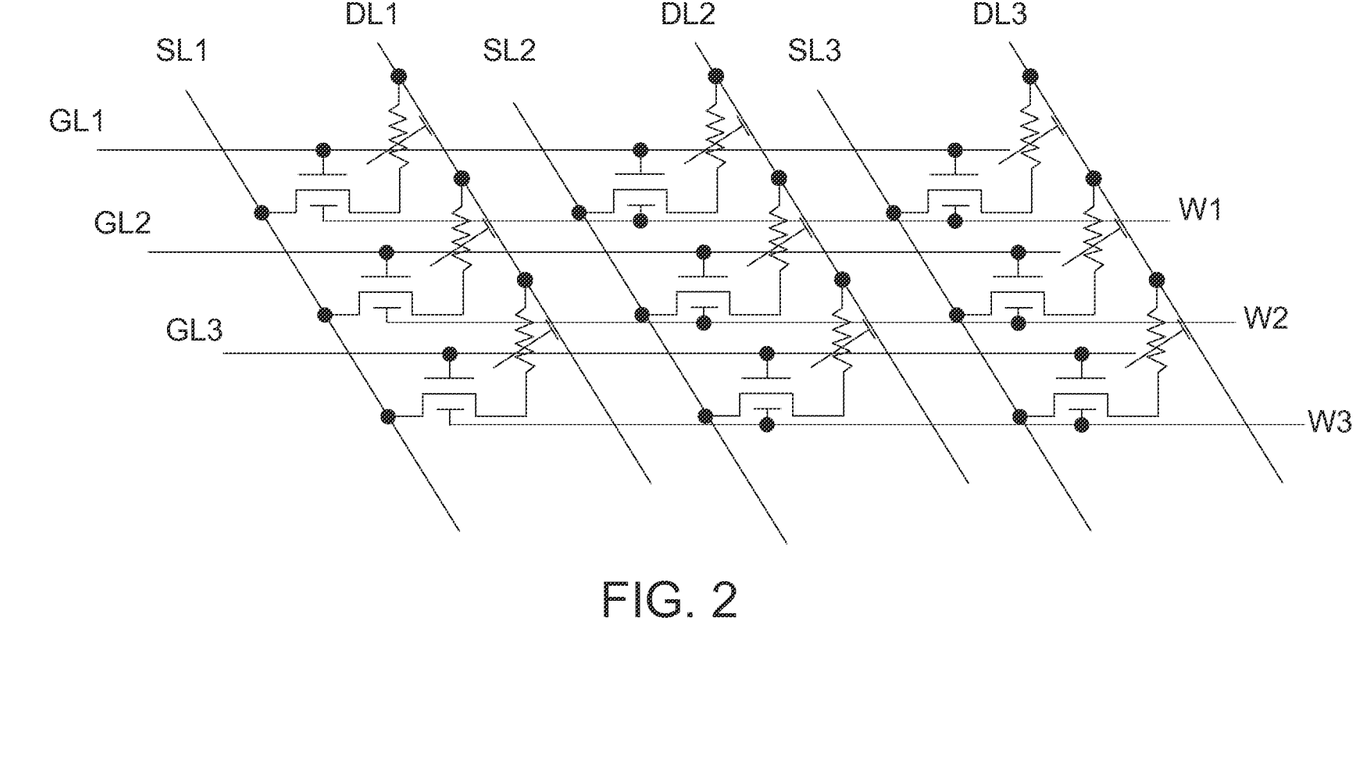
FIG. 2 shows a structure for a resistive memory according to an embodiment of the disclosure.

Now, referring to FIG. 2, which shows a memory array structure according to another embodiment of the disclosure. As shown in FIG. 2, the memory array includes: a plurality of resistive memory cells arranged in an array; a plurality of drain signal lines DL1~DL3, each drain signal line coupled to the resistive memory cells in the same column; a plurality of source signal lines SL1~SL3, each source signal line coupled to the resistive memory cells in the same column; a plurality of gate signal lines GL1~GL3, each gate signal line coupled to the resistive memory cells in the same row; and a plurality of well signal lines W1~W3, each well signal line coupled to the resistive memory cells in the same row. The well signal line is perpendicular to the drain signal line and the source signal line but parallel to the gate signal line.

In FIG. 2 and the following drawings, the number of the signal lines and the resistive memory cells is just for an example and not to limit the disclosure.

Figure 3A:
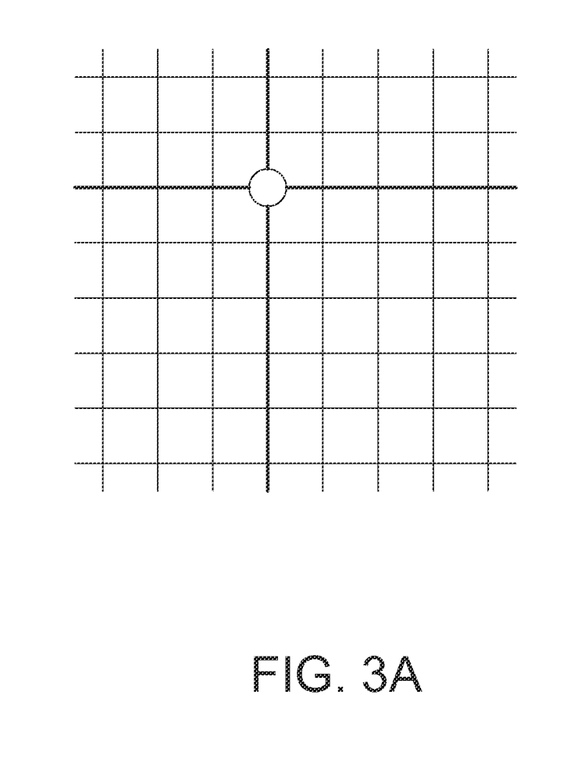
FIGS. 3A-3D show four erase modes according to an embodiment of the disclosure.
Figure 3B:
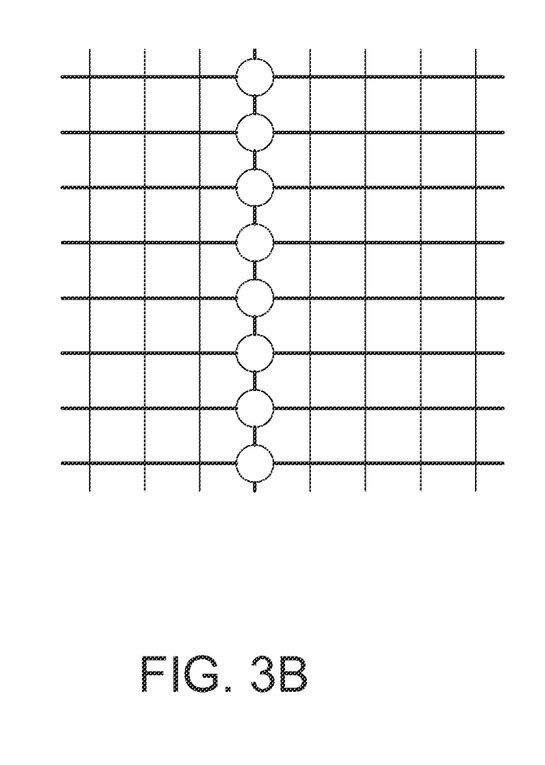
Figure 3C:
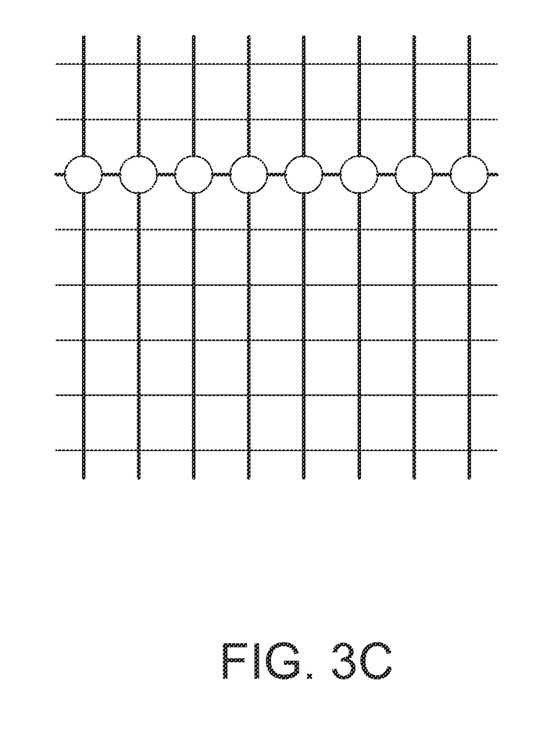
Figure 3D:
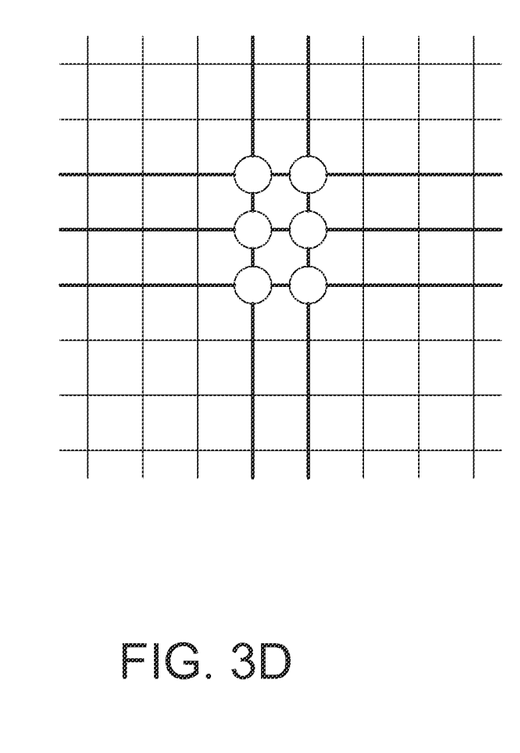

Now, the voltage biasing applied to the memory array of FIG. 2 is described. For simplicity, the voltage biasing is listed in Table 1. It is noted that, the programming operation is performed on a single resistive memory cell (that is to say, if 20 resistive memory cells are to be programmed, then the 20 resistive memory cells are programmed one after one). In erase, one single resistive memory cell is erased (i.e. a single cell mode), as shown in FIG. 3A; the resistive memory cells in the same column coupled to the same drain signal line are erased (i.e. a DL page mode), as shown in FIG. 3B; the resistive memory cells in the same row coupled to the same gate signal line are erased (i.e. a GL page mode), as shown in FIG. 3C; or the resistive memory cells coupled to the selected drain signal line(s) and the selected gate signal line(s) are erased (i.e. a block mode), as shown in FIG. 3D.

TABLE 1

|   |    | Program | Erase (single cell mode) | Erase (DL page mode) | Erase (GL page mode) | Erase (block mode) | read |
|---|----|---------|--------------------------|----------------------|----------------------|--------------------|------|
| S | DL | +Vp_DL  | 0 V                      | 0 V                  | 0 V                  | 0 V                | +Vr_DL |
|   | SL | 0 V     | ≥+Ve_W or floating       | ≥+Ve_W or floating   | ≥+Ve_W or floating   | ≥+Ve_W or floating | 0 V  |
|   | GL | +Vp_GL  | 0 V                      | 0 V                  | 0 V                  | 0 V                | +Vr_GL |
|   | W  | 0 V     | +Ve_W                    | +Ve_W                | +Ve_W                | +Ve_W              | 0 V  |

TABLE 1-continued

|  |  | Program | Erase (single cell mode) | Erase (DL page mode) | Erase (GL page mode) | Erase (block mode) | read |
|---|---|---|---|---|---|---|---|
| UN | DL | 0 V or floating | ≥+Ve_W or floating | ≥+Ve_W or floating | N/A (selecting all) | ≥+Ve_W or floating | 0 V or floating |
|  | SL | 0 V or floating | ≥+Ve_W or floating | ≥+Ve_W or floating | N/A (selecting all) | ≥+Ve_W or floating | 0 V or floating |
|  | GL | 0 V | 0 V | N/A (selecting all) | 0 V | 0 V | 0 V |
|  | W | 0 V | 0 V | N/A (selecting all) | 0 V | 0 V | 0 V |

In table 1, "S" refers to selected and "UN" refers to unselected. In table 1, in DL page mode, because the resistive memory cells in the same column are erased, each gate signal line and each well signal line are selected. In DL page mode, one or mode drain signal line(s) may be selected if needed.

In GL page mode, because the resistive memory cells in the same row are erased, each drain signal line and each source signal line are selected. In GL page mode, one or mode gate signal line(s) may be selected if needed.

In block mode, the selection of the memory cells to be erased may be made if needed. For example, the four memory cells surrounded by the drain signal lines DL1~DL2 and the gate signal lines GL1~GL2 may be selected if needed.

The voltages "+Vr_DL" and "+Vr_GL" refer to positive bias voltages applied to the drain signal line DL and the gate signal line GL, respectively, in reading operation.

Figure 4:
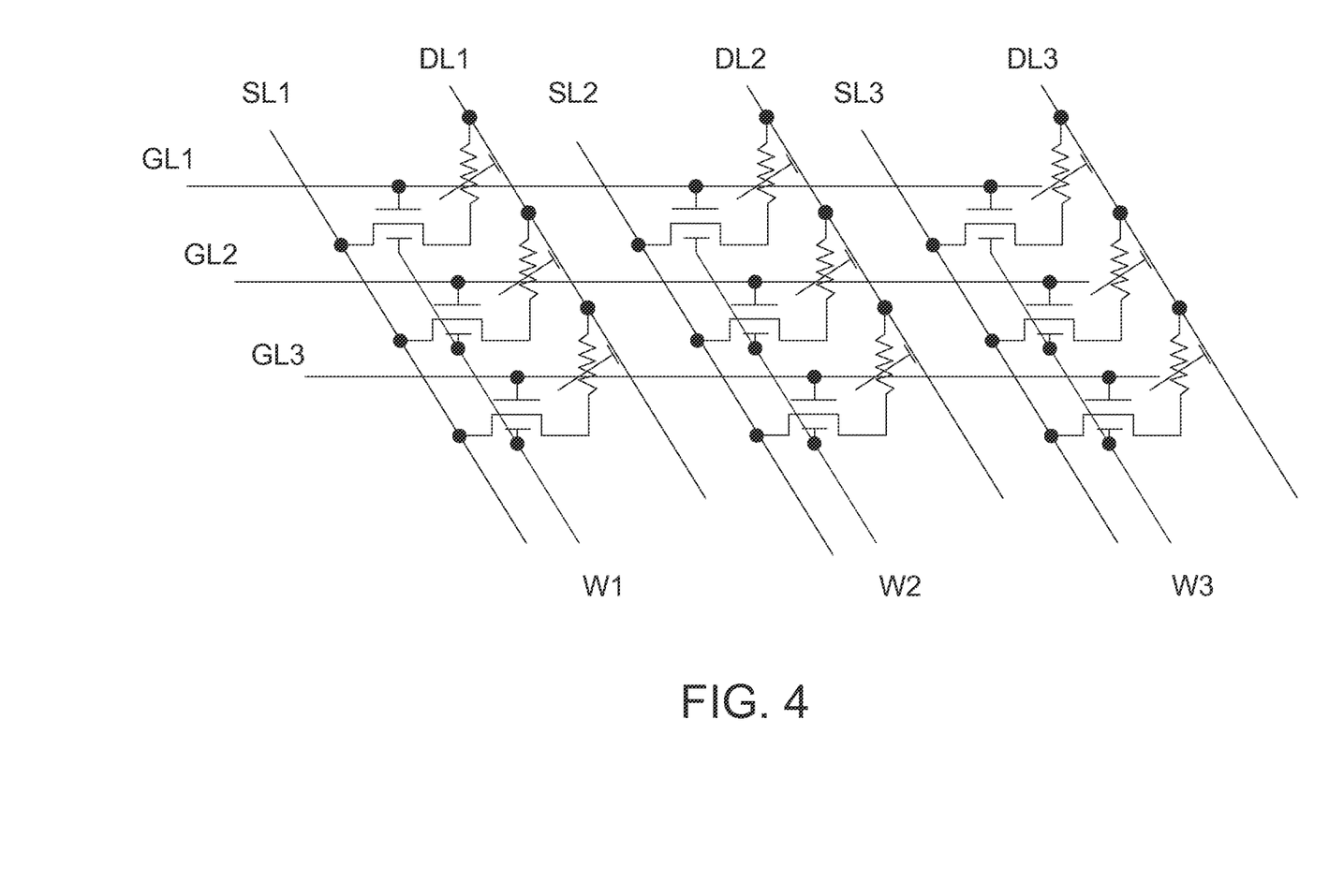
FIG. 4 shows a structure for a resistive memory according to another embodiment of the disclosure.

Now, referring to FIG. 4, which shows a memory array structure according to an embodiment of the disclosure. As shown in FIG. 4, the memory array includes: a plurality of resistive memory cells arranged in an array; a plurality of drain signal lines DL1~DL3, each drain signal line coupled to the resistive memory cells in the same column; a plurality of source signal lines SL1~SL3, each source signal line coupled to the resistive memory cells in the same column; a plurality of gate signal lines GL1~GL3, each gate signal line coupled to the resistive memory cells in the same row; and a plurality of well signal lines W1~W3, each well signal line coupled to the resistive memory cells in the same column. The well signal line is parallel to the drain signal line and the source signal line but perpendicular to the gate signal line.

Now, the voltage biasing applied to the memory array of FIG. 4 is described. For simplicity, the voltage biasing is listed in Table 2.

TABLE 2

|  |  | Program | Erase (DL page mode) | read |
|---|---|---|---|---|
| S | DL | +Vp_DL | 0 V | +Vr_DL |
|  | SL | 0 V | ≥+Ve_W or floating | 0 V |
|  | GL | +Vp_GL | 0 V | +Vr_GL |
|  | W | 0 V | +Ve_W | 0 V |
| UN | DL | 0 V or floating | 0 V or floating | 0 V or floating |
|  | SL | 0 V or floating | 0 V or floating | 0 V or floating |
|  | GL | 0 V | N/A (selecting all) | 0 V |
|  | W | 0 V | 0 V | 0 V |

In DL page mode, because the resistive memory cells in the same column are erased, each gate signal line is selected. In DL page mode, one or mode drain signal line(s) may be selected if needed.

Figure 5:
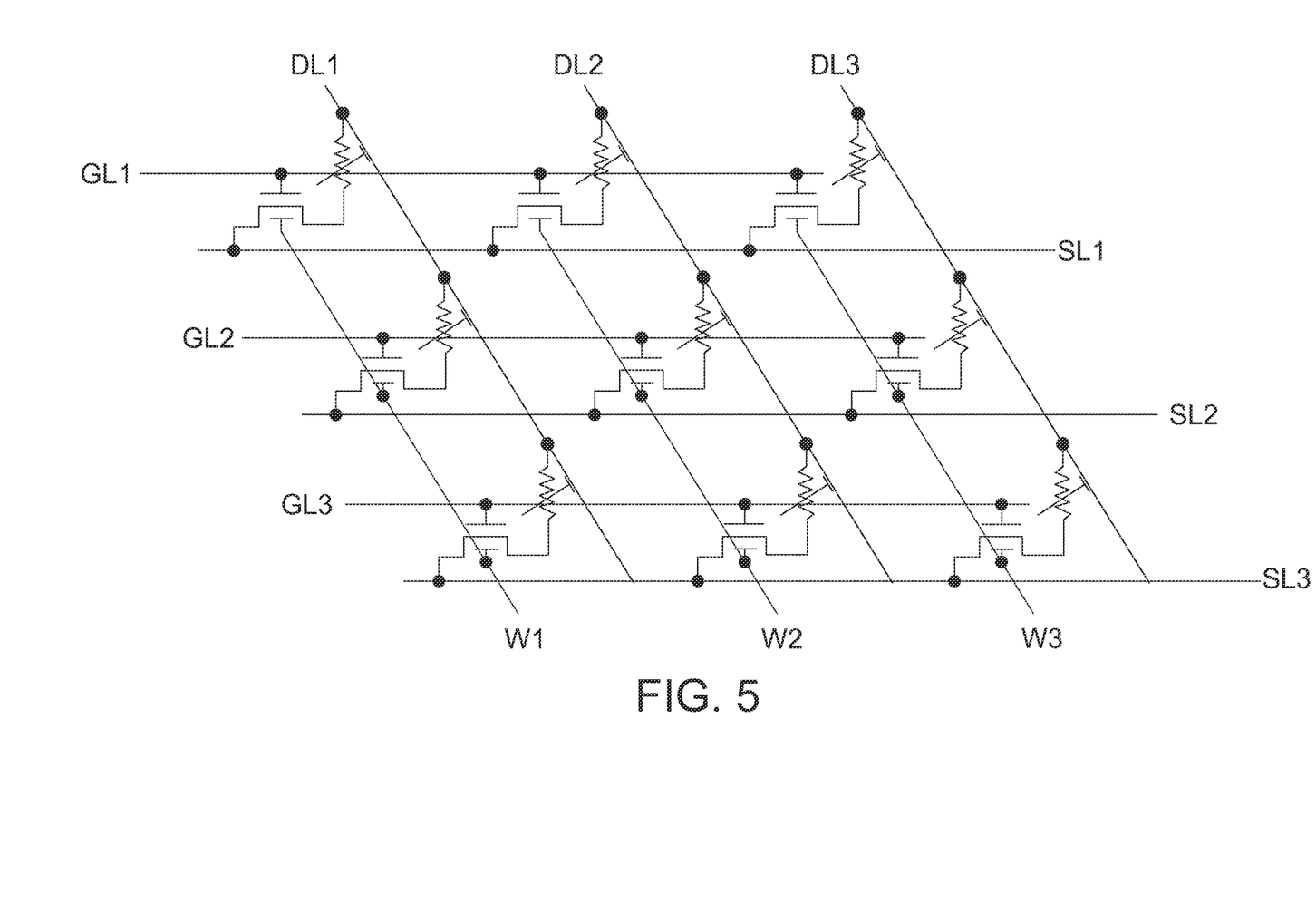
FIG. 5 shows a structure for a resistive memory according to still another embodiment of the disclosure.

Now, referring to FIG. 5, which shows a memory array structure according to another embodiment of the disclosure. As shown in FIG. 5, the memory array includes: a plurality of resistive memory cells arranged in an array; a plurality of drain signal lines DL1~DL3, each drain signal line coupled to the resistive memory cells in the same column; a plurality of source signal lines SL1~SL3, each source signal line coupled to the resistive memory cells in the same row; a plurality of gate signal lines GL1~GL3, each gate signal line coupled to the resistive memory cells in the same row; and a plurality of well signal lines W1~W3, each well signal line coupled to the resistive memory cells in the same column. The well signal line is parallel to the drain signal line but perpendicular to the source signal line and the gate signal line.

Now, the voltage biasing applied to the memory array of FIG. 5 is described. For simplicity, the voltage biasing is listed in Table 3.

TABLE 3

|  |  | Program | Erase (DL page mode) | read |
|---|---|---|---|---|
| S | DL | +Vp_DL | 0 V | +Vr_DL |
|  | SL | 0 V | ≥+Ve_W or floating | 0 V |
|  | GL | +Vp_GL | 0 V | +Vr_GL |
|  | W | 0 V | +Ve_W | 0 V |
| UN | DL | 0 V or floating | ≥+Ve_W or floating | 0 V or floating |
|  | SL | 0 V or floating | N/A (selecting all) | 0 V or floating |
|  | GL | 0 V | N/A (selecting all) | 0 V |
|  | W | 0 V | 0 V | 0 V |

In table 3, In DL page mode, because the resistive memory cells in the same column are erased, each gate signal line and each source signal line are selected. In DL page mode, one or more drain signal lines may be selected if needed.

Figure 6:
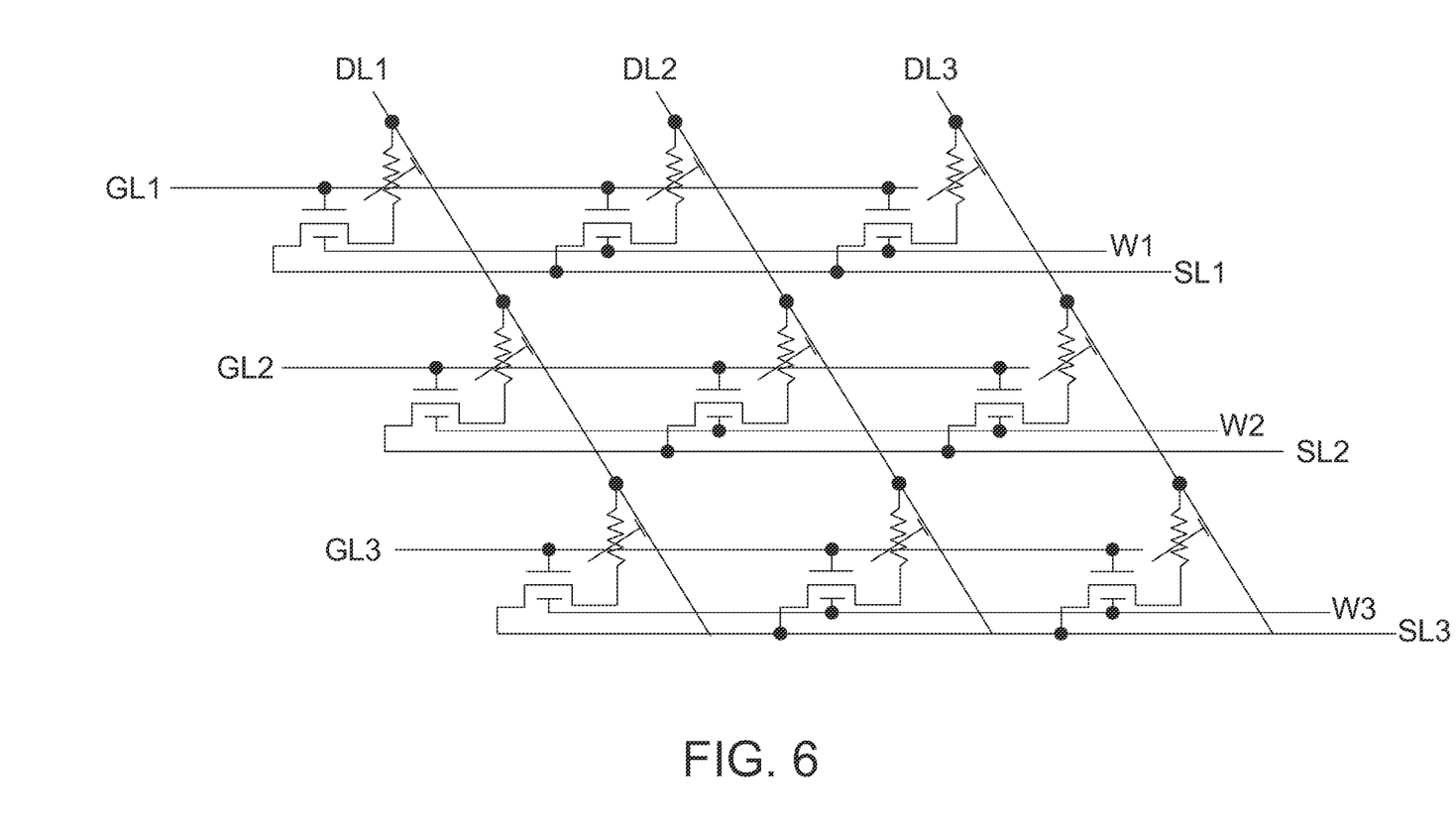
FIG. 6 shows a structure for a resistive memory according to yet another embodiment of the disclosure.

Now, referring to FIG. 6, which shows a memory array structure according to another embodiment of the disclosure. As shown in FIG. 6, the memory array includes: a plurality of resistive memory cells arranged in an array; a plurality of drain signal lines DL1~DL3, each drain signal line coupled to the resistive memory cells in the same column; a plurality of source signal lines SL1~SL3, each source signal line coupled to the resistive memory cells in the same row; a plurality of gate signal lines GL1~GL3, each gate signal line coupled to the resistive memory cells in the same row; and a plurality of well signal lines W1~W3, each well signal line coupled to the resistive memory cells in the same row. The well signal line is perpendicular to the drain signal line but parallel to the source signal line and the gate signal line.

Now, the voltage biasing applied to the memory array of FIG. 6 is described. For simplicity, the voltage biasing is listed in Table 4.

TABLE 4

| | | Program | Erase (single cell mode) | Erase (DL page mode) | Erase (GL page mode) | Erase (block mode) | read |
|---|---|---|---|---|---|---|---|
| S | DL | +Vp_DL | 0 V | 0 V | 0 V | 0 V | +Vr_DL |
| | SL | 0 V | ≥+Ve_W or floating | ≥+Ve_W or floating | ≥+Ve_W or floating | ≥+Ve_W or floating | 0 V |
| | GL | +Vp_GL | 0 V | 0 V | 0 V | 0 V | +Vr_GL |
| | W | 0 V | +Ve_W | +Ve_W | +Ve_W | +Ve_W | 0 V |
| UN | DL | 0 V or floating | ≥+Ve_W or floating | ≥+Ve_W or floating | N/A (selecting all) | ≥+Ve_W or floating | 0 V or floating |
| | SL | 0 V or floating | ≥+Ve_W or floating | N/A (selecting all) | 0 V | 0 V | 0 V or floating |
| | GL | 0 V | 0 V | N/A (selecting all) | 0 V | 0 V | 0 V |
| | W | 0 V | 0 V | N/A (selecting all) | 0 V | 0 V | 0 V |

In table 4, In DL page mode, because the resistive memory cells in the same column are erased, each gate signal line, each source signal line and each well signal line are selected. Similarly, in GL page mode, because the resistive memory cells in the same row are erased, each drain signal line is selected. The program operation, the single cell erase mode, the block erase mode and the reading operation are the same in table 1 and table 4 and thus the details are omitted.

The transistor applicable to the disclosed embodiment includes, for example but not limited to: NMOS transistor, PMOS transistor, NPN BJT, PNP BJT or the like. The memory element applicable to the disclosed embodiment includes, for example but not limited to: TMO ReRAM, including WOx resistive memory, HfOx resistive memory, TaOx resistive memory and TiOx resistive memory etc; conduction bridge memory including Cu-bridge memory and Ag-bridge memory etc; and phase change memory.

As discussed above, the embodiment disclosed an asymmetric voltage biasing applicable to a resistive memory. By flowing the erase current (as shown in FIG. 1B) from the well region of the transistor to the memory element, the body effect of the transistor is eliminated and the program and erase operation has better performance. As for the body effect in the current resistive memory, the node voltage between the transistor and the resistive memory element, which is equal to a multiplication result of the erase current and the resistance value of the resistive memory element, will reduce the gate-source voltage difference of the transistor and thus the current flowing through the transistor (i.e. the erase current) will also be reduced. However, in the disclosed embodiment, because the positive erase bias voltage is applied to the well region of the transistor and in the erase operation, the transistor is turned off (so the erase current will not flow through the transistor). Therefore, the body effect of the transistor will not affect the erase operation.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An operation method for a resistive memory cell including a transistor and a resistive memory element, the operation method comprising:
in a programming operation, flowing a programming current through the transistor and the resistive memory element to change the resistive memory element from a first resistance state into a second resistance state; and
in an erase operation, applying a positive bias voltage at a first terminal of the transistor, applying another positive bias voltage, lower than the positive bias voltage applied at the first terminal of the transistor, at a well terminal of the transistor, and flowing an erase current from a well region of the transistor to the resistive memory element to change the resistive memory element from the second resistance state into the first resistance state, wherein the erase current does not flow through the transistor.

2. The operation method according to claim 1, wherein the resistive memory element has a resistance in the first resistance state higher than in the second resistance state.

3. The operation method according to claim 1, wherein in the programming operation,
applying a first positive bias voltage at a first terminal of the resistive memory element;
applying a second positive bias voltage at a control terminal of the transistor;
applying a ground voltage at the first terminal of the transistor, wherein a second terminal of the transistor is coupled to a second terminal of the resistive memory element; and
applying the ground voltage at the well terminal of the transistor.

4. The operation method according to claim 3, wherein the programming current flows from the resistive memory element toward the transistor and the transistor is in saturation.

5. The operation method according to claim 3, wherein in the erase operation,
applying the ground voltage at the first terminal of the resistive memory element;
applying the ground voltage at the control terminal of the transistor;
applying a third positive bias voltage at the first terminal of the transistor; and
applying a fourth positive bias voltage at the well terminal of the transistor, wherein the third positive bias voltage is higher than the fourth positive bias voltage.

6. The operation method according to claim 1, wherein the programming current has a direction asymmetric to the erase current.

7. A memory structure, comprising:
a plurality of resistive memory cells, arranged in an array;
a plurality of drain signal lines, each drain signal line coupled to the resistive memory cells in the same column;

a plurality of gate signal lines, each gate signal line coupled to the resistive memory cells in the same row, and each drain signal line vertical to each gate signal line;

a plurality of source signal lines, each source signal line coupled to the resistive memory cells in the same column or in the same row and each source signal line vertical or parallel to each drain signal line; and a plurality of well signal lines, each well signal line coupled to respective well regions of respective transistors of the resistive memory cells in the same column or in the same row and each well signal line vertical or parallel to each drain signal line.

8. The memory structure according to claim 7, wherein in a programming operation, a first positive bias voltage is applied at a selected one among the drain signal lines and a ground voltage is applied at unselected ones among the drain signal lines or the unselected drain signal lines are floated;

the ground voltage is applied at a selected one among the source signal lines and the ground voltage is applied at unselected ones among the source signal lines or the unselected source signal lines are floated;

a second positive bias voltage is applied at a selected one among the gate signal lines and the ground voltage is applied at unselected ones among the gate signal lines; and the ground voltage is applied at all the well signal lines.

9. The memory structure according to claim 8, wherein each source signal line is coupled to the resistive memory cells on the same column and is parallel to each drain signal line; and each well signal line is coupled to respective well regions of respective transistors of the resistive memory cells on the same row and is parallel to each gate signal line.

10. The memory structure according to claim 9, wherein in a single cell erase operation, the ground voltage is applied at a selected one among the drain signal lines and a third positive bias voltage is applied at unselected ones among the drain signal lines or the unselected drain signal lines are floated;

the third positive bias voltage is applied at all the source signal lines or all the source signal lines are floated;

the ground voltage is applied at all the gate signal lines; and a fourth positive bias voltage is applied at a selected one among the well signal lines and the ground voltage is applied at unselected ones among the well signal lines, the third positive bias voltage is higher than the fourth positive bias voltage;

in a drain signal line page erase operation, the ground voltage is applied at a selected one among the drain signal lines and the third positive bias voltage is applied at unselected ones among the drain signal lines or the unselected drain signal lines are floated;

the third positive bias voltage is applied at all the source signal lines or all the source signal lines are floated;

the ground voltage is applied at all the gate signal lines; and the fourth positive bias voltage is applied at all the well signal lines; and in a gate signal line erase operation, the ground voltage is applied at all the drain signal lines;

the third positive bias voltage is applied at all the source signal lines or all the source signal lines are floated;

the ground voltage is applied at all the gate signal lines; and the fourth positive bias voltage is applied at a selected one among the well signal lines and the ground voltage is applied at unselected ones among the well signal lines; and in a block erase operation, the ground voltage is applied at a selected one among the drain signal lines, and the third positive bias voltage is applied at unselected ones among the drain signal lines or the unselected drain signal lines are floated;

the third positive bias voltage is applied at all the source signal lines or all the source signal lines are floated;

the ground voltage is applied at all the gate signal lines; and the fourth positive bias voltage is applied at a selected one among the well signal lines and the ground voltage is applied at unselected ones among the well signal lines.

11. The memory structure according to claim 8, wherein each source signal line is coupled to the resistive memory cells on the same column and is parallel to each drain signal line; and each well signal line is coupled to respective well regions of respective transistors of the resistive memory cells on the same column and is parallel to each drain signal line.

12. The memory structure according to claim 11, wherein in a drain signal line page erase operation, the ground voltage is applied at a selected one among the drain signal lines and the ground voltage is applied at unselected ones among the drain signal lines or the unselected drain signal lines are floated;

a third positive bias voltage is applied at a selected one among the source signal lines or the selected source signal line is floated, and the ground voltage is applied at unselected ones among the source signal lines;

the ground voltage is applied at all the gate signal lines; and a fourth positive bias voltage is applied at a selected one among the well signal lines and the ground voltage is applied at unselected ones among the well signal lines, the third positive bias voltage is higher than the fourth positive bias voltage.

13. The memory structure according to claim 8, wherein each source signal line is coupled to the resistive memory cells on the same row and is perpendicular to each drain signal line; and each well signal line is coupled to respective well regions of respective transistors of the resistive memory cells on the same column and is parallel to each drain signal line.

14. The memory structure according to claim 13, wherein in a drain signal line page erase operation, the ground voltage is applied at a selected one among the drain signal lines and a third positive bias voltage is applied at unselected ones among the drain signal lines or the unselected drain signal lines are floated;

the third positive bias voltage is applied at all the source signal lines or all the source signal lines are floated;

the ground voltage is applied at all the gate signal lines; and a fourth positive bias voltage is applied at a selected one among the well signal lines and the ground voltage is applied at unselected ones among the well signal lines, the third positive bias voltage is higher than the fourth positive bias voltage.

15. The memory structure according to claim 8, wherein each source signal line is coupled to the resistive memory cells on the same row and is perpendicular to each drain signal line; and each well signal line is coupled to respective well regions of respective transistors of the resistive memory cells on the same row and is perpendicular to each drain signal line.

16. The memory structure according to claim 15, wherein in a single cell erase operation, the ground voltage is applied at a selected one among the drain signal lines and a third positive bias voltage is applied at unselected ones among the drain signal lines or the unselected drain signal lines are floated;

the third positive bias voltage is applied at all the source signal lines or all the source signal lines are floated;

the ground voltage is applied at all the gate signal lines; and a fourth positive bias voltage is applied at a selected one among the well signal lines and the ground voltage is applied at unselected ones among the well signal lines, the third positive bias voltage is higher than the fourth positive bias voltage;

in a drain signal line page erase operation, the ground voltage is applied at a selected one among the drain signal lines and the third positive bias voltage is applied at unselected ones among the drain signal lines or the unselected drain signal lines are floated;

the third positive bias voltage is applied at all the source signal lines or all the source signal lines are floated;

the ground voltage is applied at all the gate signal lines; and the fourth positive bias voltage is applied at all the well signal lines; and in a gate signal line erase operation, the ground voltage is applied at all the drain signal lines;

the third positive bias voltage is applied at a selected one among the source signal lines or the selected source signal line is floated, and the ground voltage is applied at unselected ones among the source signal lines;

the ground voltage is applied at all the gate signal lines; and the fourth positive bias voltage is applied at a selected one among the well signal lines and the ground voltage is applied at unselected ones among the well signal lines; and in a block erase operation, the ground voltage is applied at a selected one among the drain signal lines, and the third positive bias voltage is applied at unselected ones among the drain signal lines or the unselected drain signal lines are floated;

the third positive bias voltage is applied at a selected one among the source signal lines or the selected source signal lines is floated, and the ground voltage is applied at unselected ones among the source signal lines;

the ground voltage is applied at all the gate signal lines; and the fourth positive bias voltage is applied at a selected one among the well signal lines and the ground voltage is applied at unselected ones among the well signal lines.

* * * * *